United States Patent [19]

Babich et al.

[11] Patent Number: 5,238,773
[45] Date of Patent: Aug. 24, 1993

[54] ALKALINE DEVELOPABLE PHOTORESIST COMPOSITION CONTAINING RADIATION SENSITIVE ORGANOSILICON COMPOUND WITH QUINONE DIAZIDE TERMINAL GROUPS

[75] Inventors: Edward D. Babich, Chappaqua, N.Y.; Donis G. Flagello, Ridgefield, Conn.; Michael Hatzakis, Chappaqua; Jurij R. Paraszczak, Pleasantville, both of N.Y.; Jane M. Shaw, Ridgefield, Conn.; David F. Witman, Pleasantville, N.Y.

[73] Assignee: International Business Machines Corporation, Armonk, N.Y.

[21] Appl. No.: 895,245

[22] Filed: Jun. 8, 1992

Related U.S. Application Data

[63] Continuation of Ser. No. 619,675, Nov. 29, 1990, abandoned, which is a continuation of Ser. No. 264,482, Oct. 28, 1988, abandoned.

[51] Int. Cl.$^5$ .................. G03F 7/023; G03F 7/075
[52] U.S. Cl. .................................... 430/190; 430/191; 430/192; 430/193; 430/313

[58] Field of Search ............... 430/190, 192, 193, 270, 430/313, 191

[56] References Cited

U.S. PATENT DOCUMENTS

| 4,603,195 | 7/1986 | Babich et al. | 430/193 |
| 4,722,881 | 2/1988 | Ueno et al. | 430/192 |

FOREIGN PATENT DOCUMENTS

| 58-48045 | 3/1983 | Japan | 430/190 |
| 59-180545 | 10/1984 | Japan | 430/190 |
| 62-212645 | 9/1987 | Japan | 430/190 |
| 62-231250 | 10/1987 | Japan | 430/190 |

OTHER PUBLICATIONS

Shaw, J. et al., "Polysiloxanes for Optical Lithography", *Solid State Technology*, Jun. 1987, pp. 83–89.

Primary Examiner—Charles L. Bowers, Jr.
Assistant Examiner—Christopher G. Young
Attorney, Agent, or Firm—Pollock, Vande Sande & Priddy

[57] ABSTRACT

A composition containing an organosilicon material having terminal quinone groups, and a phenolic-novolak polymer, and use thereof in photolithography.

18 Claims, No Drawings

ALKALINE DEVELOPABLE PHOTORESIST COMPOSITION CONTAINING RADIATION SENSITIVE ORGANOSILICON COMPOUND WITH QUINONE DIAZIDE TERMINAL GROUPS

This is a continuation of application Ser. No. 07/619,675, filed Nov. 29, 1990, now abandoned, which is a continuation of Ser. No. 07/264,482 filed on Oct. 28, 1988, now abandoned.

TECHNICAL FIELD

The present invention is concerned with compositions which are capable of being imaged upon exposure to actinic radiation. The compositions of the present invention are also resistant to oxygen-containing plasma. In addition, the present invention is concerned with the use of the compositions in lithography. For example, the composition of the present invention are suitable for imaging on all optical lithography tools and for packaging applications, such as multi-layer ceramic packaging devices.

BACKGROUND ART

In the manufacture of patterned devices, such as semiconductor chips and chip carriers, the processes of etching different layers which constitute the finished product are among the most crucial steps involved. One method widely employed in the etching process is to overlay the surface to be etched with a suitable mask and then to immerse the substrate and mask in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the selectivity of direction (anisotropy) considered necessary to achieve optimum dimensional consistency with current processing requirements.

Moreover, such wet etching processes are undesirable because of the environmental and safety concerns associated therewith.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched, sidewalls. A particular reactive ion etching process is disclosed, for example, in U.S. Pat. No. 4,283,249 to Ephrath, disclosure of which is incorporated herein by reference.

One problem associated with "dry-processing" techniques is providing a patternable material which is sensitive to imaging radiation while, at the same time, being sufficiently resistant to the dry-etching environment. In many instances, resistance to the dry-etching such as to the plasma etching active species results in erosion of the mask material and loss of resolution of the material employed for preparing the mask in the lithographic exposure to the imaging radiation.

This is true for both positive organic resist materials and negative organic resist materials. A positive resist material is one which on exposure to imaging radiation is capable of being rendered soluble in a solvent in which the unexposed resist is not soluble. A negative resist material is one which is capable of polymerizing and/or insolubilizing upon exposure to imaging radiation.

One type of positive photosensitive material is based upon phenol-formaldehyde novolak polymers. A particular example of such is Shipley AZ 1350 ® which is an m-cresol formaldehyde novolak polymer composition. Such is a positive resist composition and includes therein a diazoketone such as 2-diazo-1-naphthol-5-sulphonic acid ester. In such a composition, the diazoketone, during the photochemical reaction is converted to a carboxylic acid. This, in turn, makes the composition readily soluble in weakly alkali aqueous developer solvents. The composition usually contains about 15%, or so, by weight, of the diazoketone compound.

For example, U.S. Pat. No. 4,125,650 describes the use of quinone diazides as hardening agents for polymeric resists including phenol-formaldehyde.

A discussion of various photoresist materials can be found, for instance, in the *Journal of the Electrochemical Society*, Vol. 125, No. 3, March 1980, Deckert, et al., "Microlithography—Key to Solid-State Fabrication", pp. 45C–56C, disclosure of which is incorporated herein by reference.

Additional discussion of the use of quinone diazides in light-sensitive applications can be found in "Quinone Diazides", Erschov, et al., "Elsevier Scientific Publications", Amsterdam. 1981, Chapter 8, pp.282–297, disclosure of which is incorporated herein by reference. In addition, it has been suggested therein to employ condensation products of 1,2-naphthoquinone-5-chlorosulphonic acid and certain silicon derivatives to improve the adhesion property of various films to a substrate whereby the condensation products are employed as light-sensitive backing thereof.

In addition, certain siloxanes have been suggested as reactive ion etch barriers. For instance, see Fried, et al., IBM, *Journal Research Development*, Vol. 26. No. 8 pp. 362–371. Also, certain siloxanes have been suggested as e-beam sensitive resists. For instance, see Roberts, *Journal of Electrochemical Society*, Vol. 120, p. 1716, 1973; Roberts, *Phillips Technical Review*, Vol. 35, pp. 41–52, 1975; and Gazard, et al., *Applied Polymer Symposium*, No. 23, pp. 106–107, 1974.

Moreover, there have been suggestions that certain siloxanes, when imaged with electron beam (see Hatzakis, et al., "Processing Microcircuit Engineering", Lausanne, p. 396, September 1981); and deep U.V. at about 2537 angstrom (see Shaw, et al., *SPE Photopolymer Conference*, November 1982) act as an etch mask for an underlying polymer layer in an oxygen plasma. However, these siloxane materials suggested require very limited methods for imaging (e.g., e-beam and deep U.V.) and are not imageable with radiation of longer wavelengths (e.g., greater than 2700A), where the majority of lithographic imaging tools, contact, and projection printers operate.

U.S. Pat. No. 4,603,195 to Babich, et al. discloses materials which are resistant to dry-processing techniques and especially to reactive ion etching in oxygen plasma while, at the same time, capable of providing high resolution images.

The compositions disclosed therein are obtained by interacting a quinone diazo compound and an organosilicon compound and functions as negative resist materials.

In addition, examples of some dry-developable resists are provided in U.S. Pat. Nos. 4,426,247 to Tamamura, et al.; 4,433,044 to Meyer, et al.; 4,357,369 to Kilichowski, et al.; 4,430,153 to Gleason, et al.; 4,307,178 to Kaplan, et al.; 4,389,482 to Bargon, et al.; and 4,396,704 to Taylor. Further, German patent application OS 32 15082 (English language counterpart British patent application 2097143) suggests a process for obtaining negative tone plasma resist images. Such is concerned with a process involving entrapment of a silicon-containing monomer into a host film at the time of exposure to radiation and requires a processing step to expel the unincorporated silicon monomer from the film before plasma developing of the relief image.

A more recent example of a plasma developable resist is described in U.S. Pat. No. 4,552,833 in which a method is provided for obtaining a resist which is stated to be radiation sensitive and oxygen plasma developable. Such process involves coating a substrate with a film of a polymer that contains a masked reactive functionality; imagewise exposing the film to radiation under conditions that cause unmasking of the reactive functionality in the exposed regions of the film; treating the exposed film with a reactive organometallic reagent; and then developing the relief image by treatment with an oxygen plasma. The specific organometallic reagents described therein are trimethylchlorostannan, hexamethyldisilazane, and trimethylchlorosilane.

In addition, a method of obtaining a two-layer resist by top imaging a single layer resist is described in U.S. patent application Ser. No. 679,527 (FI9-84046, assigned to the assignee of the present application) which employs a monofunctional organometallic reagent.

Moreover, U.S. patent application Ser. No. 713,509 (assigned to the assignee of the present application) describes oxygen plasma resistant materials obtained by reacting a polymeric material with a multi-functional organometallic material. The organometallic material contains at least two functional groups which are reacted with reactive groups of the polymeric material. The polymeric material contains reactive hydrogen functional groups, and/or reactive hydrogen functional precursor groups.

The disclosures of the above two U.S. patent application are incorporated herein by reference.

A further disclosure of photosensitive compositions containing organosilicon compounds can be found in U.S. Pat. No. 4,693,960.

SUMMARY OF THE INVENTION

The present invention provides materials that are resistant to dry-processing techniques and especially to reactive ion etching in oxygen plasmas while at the same time, capable of providing high resolution images. The materials of the present invention provide for positive resist materials and can be developed using alkaline solutions. In addition, the materials of the present invention can be made highly sensitive to not only e-beam and deep U.V. irradiation (<3300 angstroms), but also to all forms of imaging radiation including near U.V. (about 3300 to about 4400 angstroms), ion-beam irradiation, x-ray irradiation, and neutron radiation. The composition of the present invention are also thermally stable. Moreover, the compatibility of the constituents of the present invention with each other tends to prevent separation of the components and leads to the formation of uniform composition of the films obtained therefrom.

The present invention is concerned with a composition that contains:

A) an organosilicon compound having quinone diazo groups as the terminal groups thereof; and B) phenolic-novolak polymer. The relative amount of the organosilicon compound is about 5% to about 50% and the amount of the phenolic polymer is about 95% to about 50% by weight based upon the total weight of the organosilicon compound and the phenolic-novolak polymer.

The present invention is also concerned with a process for producing an image which includes providing on a substrate a layer of the organosilicon and phenolic composition of the type disclosed above; imagewise exposing the layer to imaging radiation in a desired pattern and developing the exposed layer, thereby leaving the desired patterns remaining on the substrate.

BEST AND VARIOUS MODES FOR CARRYING OUT INVENTION

The organosilicon compounds employed in the compositions of the present invention must contain quinone diazo groups as the terminal groups. Some examples of organosilicon compounds are represented by the following structural formulae:

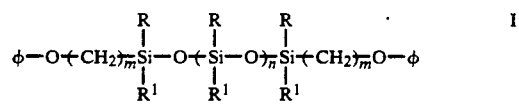

I

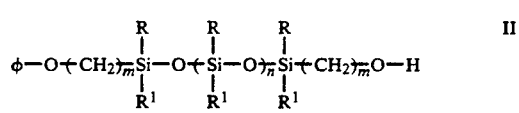

II

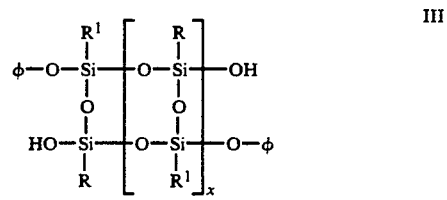

III

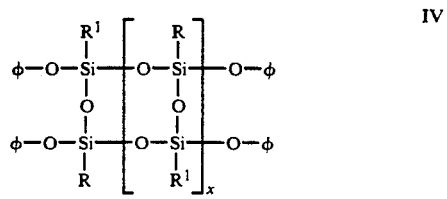

IV

-continued

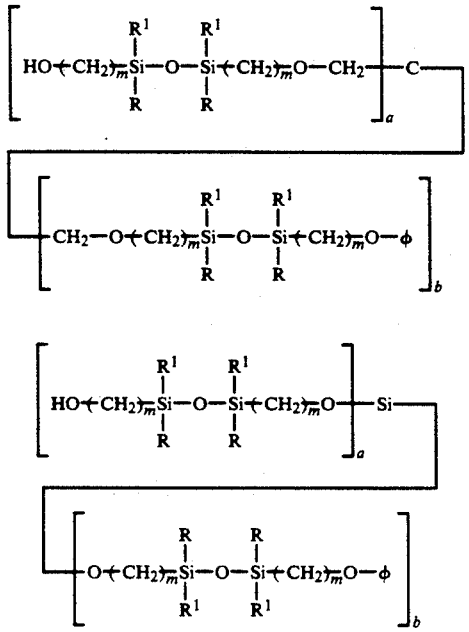

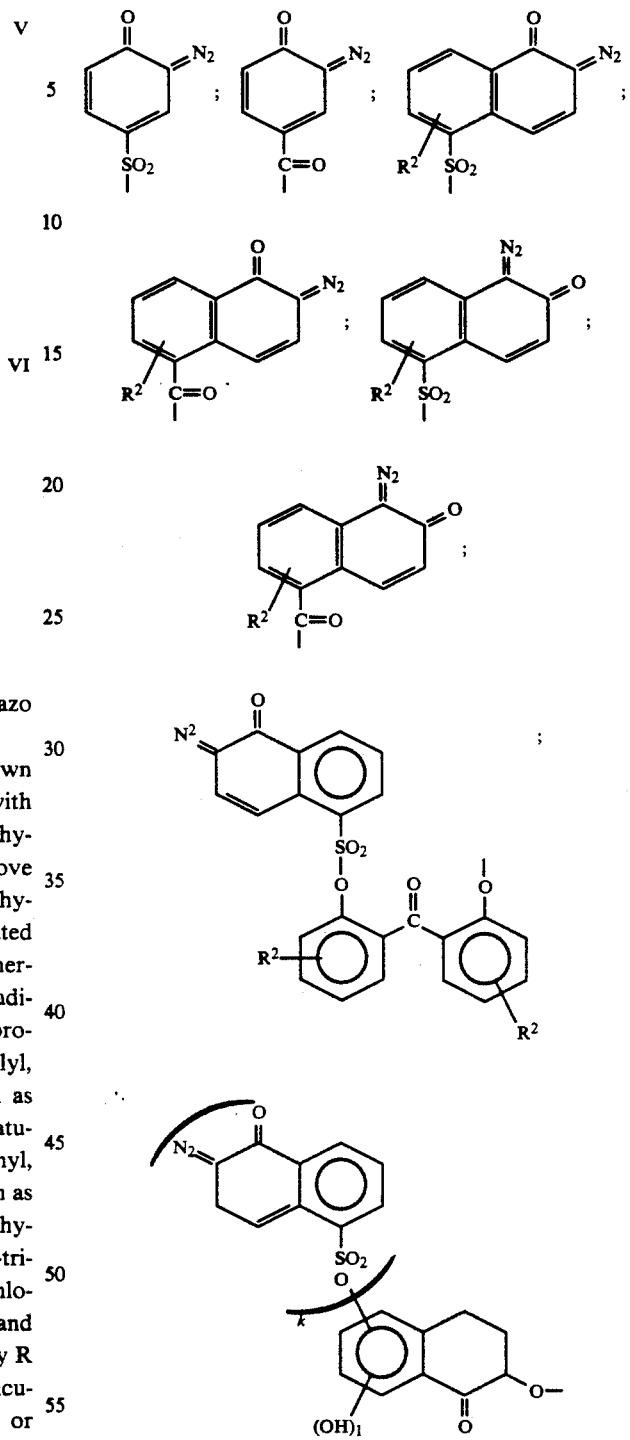

wherein each φ individually represents a quinone diazo group.

Each R and $R^1$ in the above formula are well-known and are typified by radicals usually associated with silicon-bonded organic groups and silicon-bonded hydrogen groups. Each R and $R^1$ radical in the above formula is individually selected from the group of hydrogen, monovalent hydrocarbon radicals, halogenated monovalent hydrocarbon radicals, epoxy groups, mercapto radicals, and cyanoalkyl radicals. Thus, the radicals R and $R^1$ may be alkyl, such as methyl, ethyl, propyl, butyl, and octyl; aryl radicals such as phenyl, tolyl, xylyl, and naphthyl radicals, aralkyl radicals such as benzyl, and phenylethyl radicals; olefinically unsaturated monovalent hydrocarbon radicals such as vinyl, allyl, cyclohexenyl radicals; cycloalkyl radicals such as cyclohexyl, cycloheptyl; halogenated monovalent hydrocarbon radicals such as dichloropropyl, 1,1,1-trifluoropropyl, chlorophenyl, dibromophenyl, and chloromethyl; cyanoalkyl radicals such as cyanoethyl, and cyanopropyl. Preferably, the radicals represented by R and $R^1$ have less than eight carbon atoms and in particular it is preferred that R and $R^1$ be methyl, ethyl, or phenyl.

Each m is an integer from 1 to 12 and preferably 1 to 3 and n is an integer of 0 to $10^3$ and preferably to 1 to 20. Each x is an integer from 1 to $10^2$ and preferably about 10 to about 20. Each b is an integer from 1 to 4 and each a is an integer of 4-b.

Examples of suitable quinone diazo groups are the quinone-(1,2)-diazo groups and include those of the benzene, naphthalene and phenanthrene series. Some examples of quinone diazo groups include:

wherein k represents an integer from 1 to 3 and preferably 1 to 2, and l represents an integer from 0 to 2 and preferably 1 to 2.

Each $R^2$ in the above formulas is individually hydrogen or a monovalent hydrocarbon radical.

Thus, the radical $R^2$ may be alkyl, such as methyl, ethyl, propyl, butyl, and octoyl; aryl radicals such as phenyl, tolyl, xylyl, and naphthyl radicals; aralkyl radicals such as benzyl, phenylethyl radicals; cycloalkyl radicals such as cyclohexyl and cycloheptyl. Preferably, the radicals represented by $R^2$ have less than eight carbon atoms and in particular it is preferred the $R^2$ be hydrogen, methyl, ethyl, or phenyl.

An example of a suitable organosilicon employed in the present invention is represented by the formula:

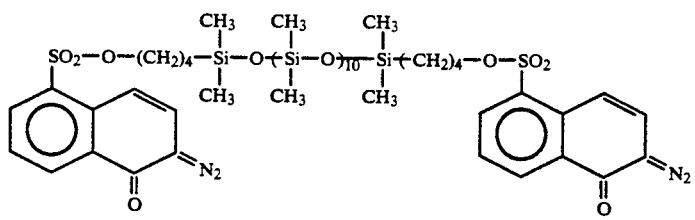

Other specific organosilicons are set forth in the examples hereinbelow.

Organosilicon compounds employed according to the present invention are known. Moreover, organosilicon compounds employed according to the present invention can be prepared according to the disclosure of U.S. Pat. No. 4,603,195, disclosure of which is incorporated herein by reference. For instance, see Example 8 of U.S. Pat. No. 4,603,195.

The phenolic novolak polymers employed in the present invention are well known and need not be described herein in any great detail.

The phenolic novolak employed according to the present invention can be represented by the formula:

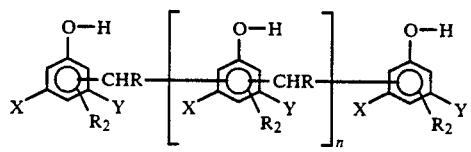

wherein n is 0 to $10^3$ and preferably about 20 to about 300; each x and y is individually hydrogen, chlorine, alkyl, or hydroxyl, each $R_2$ individuals is hydrogen, chlorine, a hydrocarbon such as alkyl, anyl, aralkyl, alkaryl and cycloalkyl.

The phenolic-aldehyde polymers are from a phenol having the formula:

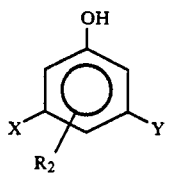

wherein X, Y, and $R_2$ have the meanings as defined above.

Hydrocarbon-substituted phenols having two available positions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and p-tert-butyl phenols, o- and p-sec butyl phenols, o- and p-amyl phenols, o- and p-octyl-phenols, 0- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenol, o-and p-phenethyl phenols, o- and p-phenyl phenols, o- and p-tolyl phenols, o- and p-cyclopentyl phenols, 4-phenethyl resorcinol, 4-tolyl resorcinol, 4-cyclohexyl resorcinol.

Various chloro-substituted phenols which can also be used in the preparation of phenol-aldehyde resins suitable for the preparation of the epoxy novolaks include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4'-chloro-phenyl-phenol, 3,5-dichloro-4-methyl-phenol, 3,5-dichloro-5-methyl-phenol, 3,5-dichloro-methyl-phenol, 3,5-dichloro-2-methyl-phenol, 2,3-dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,4-dimethyl-phenol, 2,3,5-trichlorophenol, 5-chloro-3,4-dimethyl-phenol, 2,3,5-trichlorophenol, 3,4,5-trichloro-phenol, 4-chloro-resorcinol, 4,5-dichloro-resorcinol, 4-chloro-5-methyl-resorcinol, and 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, and 5-ethyl resorcinol.

As condensing agents any aldehyde may be used which will condense with the particular phenol being used, including formaldehyde, acetaldehyde, propionaldehyde, butraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formalin.

The novolak component of the composition can include a photosensitizer such as a diazoketone as employed in commercial novolak positive resists. For example, Shipley AZ-1350 ® is an m-cresol formaldehyde novolak polymer that includes about 15%, or so, of 2-diazo-1-naphthol-5-sulphonic acid ester.

The relative amount of the organosilicon compound is usually about 5% to about 50% and preferably about 10% to about 30% by weight and the relative amount of the phenolic-novolak polymer is usually about 95% to about 50% and preferably about 90% to about 70% by weight. These relative amounts are based upon the total weight of the organosilicon compounds and phenolic-novolak polymer in the composition.

In addition, it is noted that the compounds of the present invention can be mixed with conventional additives such as solvents, fillers, plasticizers, and the like.

Suitable solvents for the compositions of the present invention include aromatic hydrocarbons such as benzene, toluene and xylene and ethers of ethylene glycol or propylene glycol and derivatives thereof such as the cellosolve solvents including cellosolve acetate (i.e., ethylene glycol monoethyl ether acetate), tetrahydrofuran, N-methyl pyrrolidinone, and amylacetate.

When used, the solvents are generally present in amounts of about 100 to about 500 based upon 100 parts by weight of the solids content of the composition.

When used as a lithographic material, the compositions of the present invention are applied to a desired substrate to provide films generally about 1500 angstroms to about 1 mil thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and especially multilayer ceramic devices. Also included are dielectric substrates which can be thermoplastic and/or thermosetting polymers. Typical thermosetting polymeric materials include epoxy, phenolic-based materials, polyamides and polyimides. The dielectric materials may be molded articles of the polymers containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins, such as polypropylene; polysulfones, polycarbonates, nitrile rubbers, and ABS polymers.

The compositions of the present invention, after being coated to the desired thickness upon a substrate, are exposed to the imaging radiation such as ultraviolet light radiation including near U.V., mid U.V., and deep U.V.; X-ray beam radiation; neutron radiation; and electron-beam radiation.

The compositions of the present invention can be developed by contacting the exposed portions with an aqueous alkaline solution such as potassium hydroxide or alcohol solution of tetramethylammonium hydroxide.

The compositions, as employed above, can then be used in a plasma etching of the underlying substrates since such are resistant to the conditions of the plasma etching. For instance, compositions of the present invention are resistant to reactive ion etching in oxygen plasma and are only etched to the extent of about 10 to 30 angstroms per minute. This compares to an etch rate of the underlying substrate such as a polyimide of about 500 to about 1000 angstroms per minute.

The following non-limiting examples are presented to further illustrate the present invention.

EXAMPLE 1

Onto a blank substrate is created a composition containing about 20 parts by weight of an oligomer of the formula:

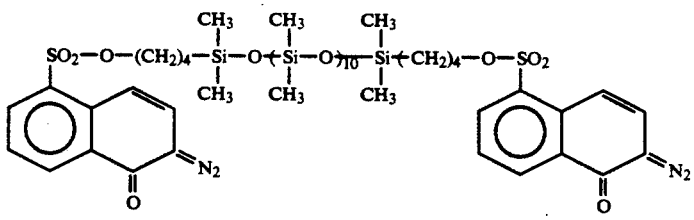

and about 20 parts by weight of Shipley AZ 1350® dissolved in about 120 parts by weight of a 4:1 mixture of cellosolve acetate and xylene. The thickness of the dried coating is about 3,000 angstroms. The material is exposed to near U.V. irradiation of about 4047 angstroms wavelength. The exposed material is removed by developing with a basic solution such as a KOH 10% aqueous solution or 10% tetramethyl ammonium hydroxide solution in alcohol.

The etch rate in oxygen plasma of the material is about 25 angstroms/minute at 10 torr pressure.

EXAMPLE 2

Example 1 is repeated, except that the organosilicon is represented by the formula:

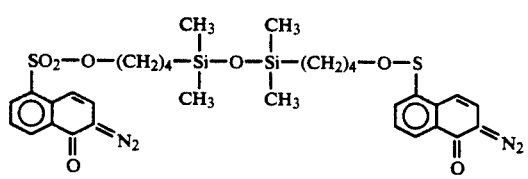

and the phenolic is a cresol-formaldehyde novolak having a molecular weight of about 9,000 and available as Varcum Resin ®.

EXAMPLE 3

Example 1 is repeated, except that the organosilicon is represented by the formula:

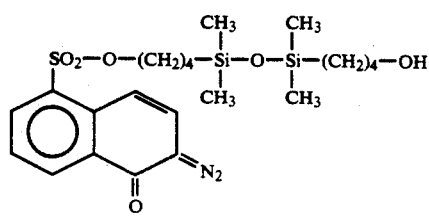

and the phenolic is a cresol-formaldehyde novolak having a molecular weight of about 9,000 and available as Varcum Resin ®.

EXAMPLE 4

Example 1 is repeated, except that the organosilicon is represented by the formula:

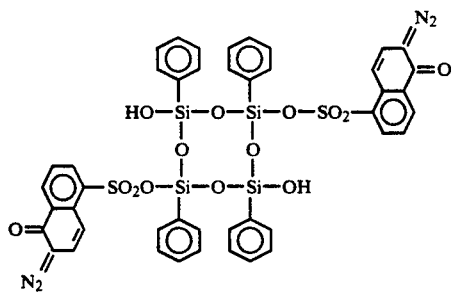

and the phenolic is a cresol-formaldehyde novolak having a molecular weight of about 9,000 and available as Varcum Resin ®.

EXAMPLE 5

Example 1 is repeated, except that the organosilicon is represented by the formula:

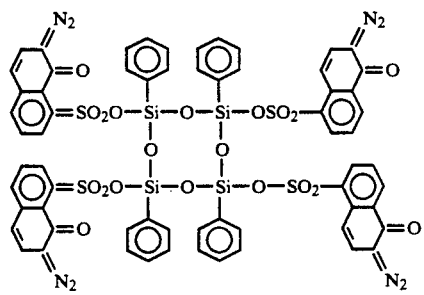

and the phenolic is a cresol-formaldehyde novolak having a molecular weight of about 9,000 and available as Varcum Resin ®.

EXAMPLE 6

Example 1 is repeated, except that the organosilicon is represented by the formula:

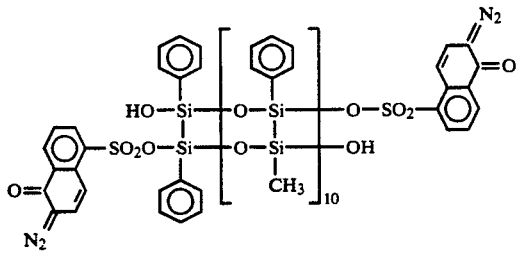

and the phenolic is a cresol-formaldehyde novolak having a molecular weight of about 9,000 and available as Varcum Resin ®.

EXAMPLE 7

Example 1 is repeated, except that the organosilicon is presented by the formula:

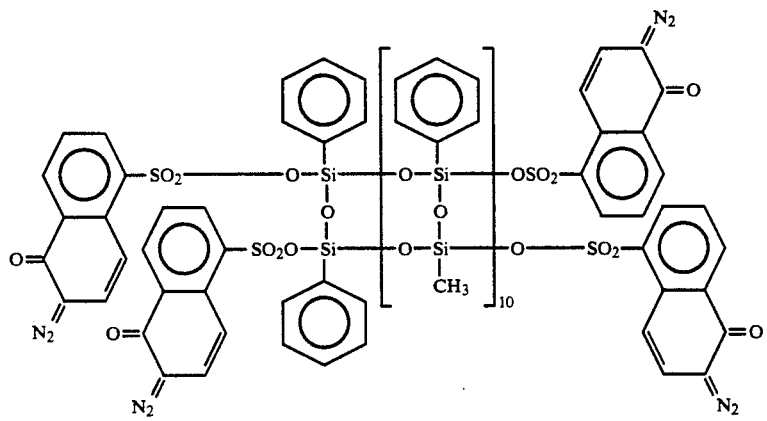

and the phenolic is a cresol-formaldehyde novolak having a molecular weight of about 9,000 and available as Varcum Resin ®.

Having thus described our invention, what we claim as new and desire to secure by Letters Patent is:

1. A positive alkaline developable photoresist and oxygen-containing plasma resistant composition comprising in admixture:

A) a radiation sensitive organosilicon compound having as the terminal groups, quinone diazide groups, and wherein said radiation sensitive organosilicon is selected from the group of compounds represented by the formulae:

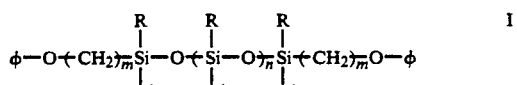

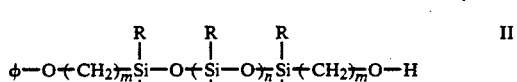

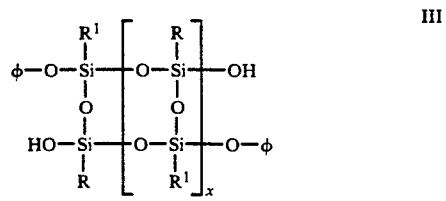

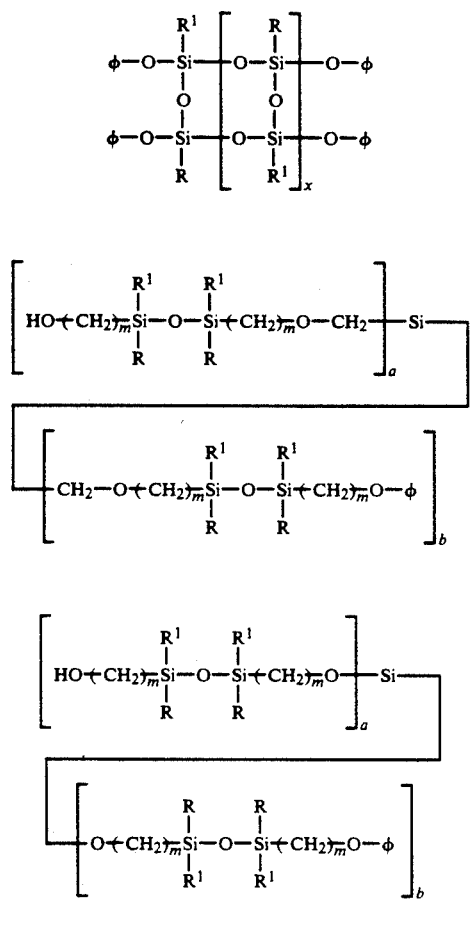

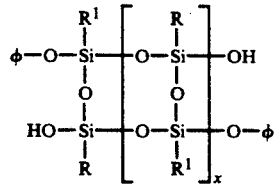

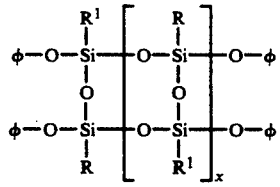

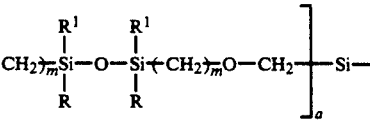

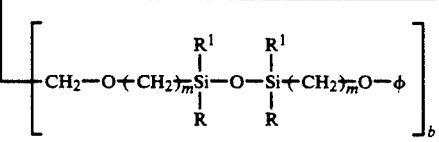

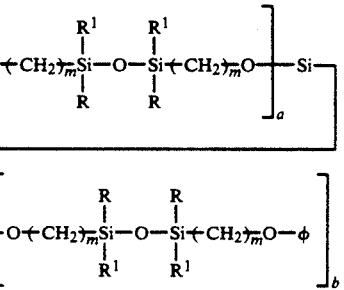

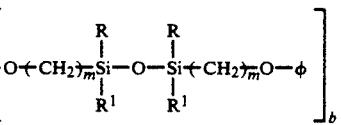

wherein each $\phi$ individually represents a quino diazo group; m is an integer from 1 to 12 and n is an integer from 0 to $10^3$; x is 1 to $10^2$; each b is an integer from 1 to 4 and each a is an integer of 4-b; and each R and $R^1$ individually is hydrogen, monovalent hydrocarbon radicals; halogenated monovalent hydrocarbon radicals, epoxy groups, mercapto groups and cyanoaldehyde radicals; and B) phenolic-novolak polymer wherein the relative amount of A is about 5% to about 50% and the amount of B is about 95% to about 50% based upon the total weight of A and B.

2. The composition of claim 1 wherein the relative amount of A is about 10% to about 30% and the relative amount of B is about 90% to about 70%.

3. The composition of claim 1 wherein said organosilicon compounds is selected from the group of compounds represented by the formulae:

4. The composition of claim 1 wherein said organosilicon compound is represented by the formula:

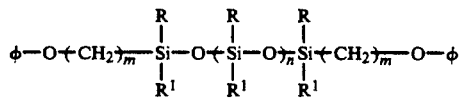

wherein each $\phi$ individually represents a quinone diazide group; m is an integer from 1 to 12 and n is an integer from 1 to $10^3$ and each R and $R^1$ individually is hydrogen; monovalent hydrocarbon radicals; halogenated monovalent hydrocarbon radicals, epoxy groups, mercapto radicals and cyanoaldehyde radicals.

5. The composition of claim 1 wherein said organosilicon is:

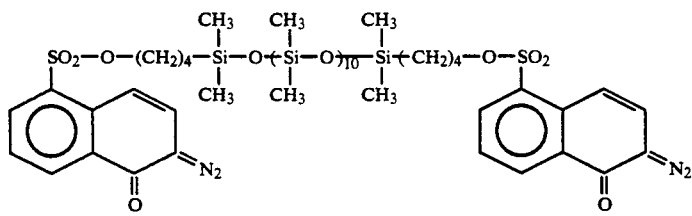

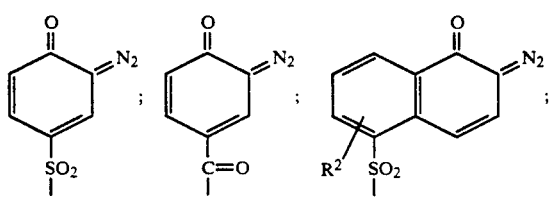

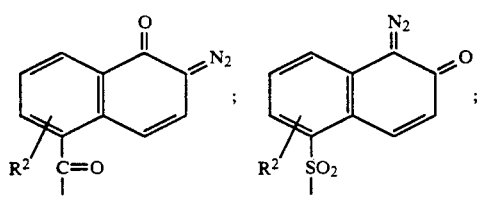

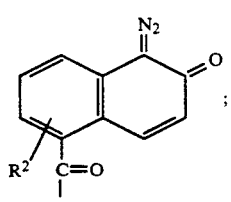

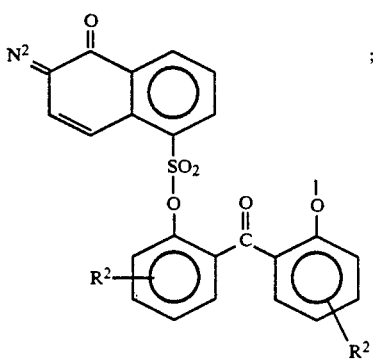

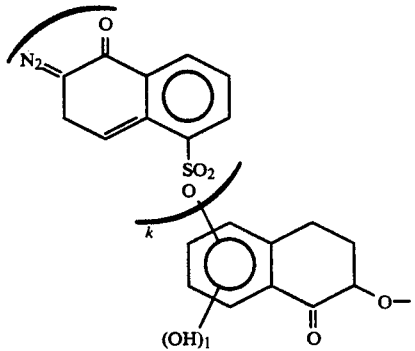

wherein k represents an integer from 1 to 3; l represents an integer from 0 to 2; each $R^2$ individually is hydrogen or a monovalent hydrocarbon radical.

8. The composition of claim 1 wherein said quinone diazide group is:

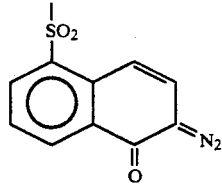

6. The composition of claim 1 wherein said quinone diazide groups are quinone-(1,2)-diazide groups of the benzene, naphthalene and phenanthrene series.

7. The composition of claim 1 wherein said quinone diazide groups are selected from the group of:

9. The composition of claim 1 wherein said novolak polymer includes a diazoketone photosensitizer.

10. The composition of claim 1 wherein said novolak polymer includes 2-diazo-1-naphthyl-5-sulphonic acid ester.

11. The composition of claim 1 which further includes a solvent in amount of about 100 to about 500 parts by weight of the solids contents of the composition.

12. The composition of claim 11 wherein said solvent is selected from the group of aromatic hydrocarbons, ethers of ethylene glycol, ethers of propylene glycol, cellosolves, tetrahydrofuran, N-methyl pyrrolidinone, and amylacetate.

13. The composition of claim 1 wherein said organosilicon is represented by the formula:

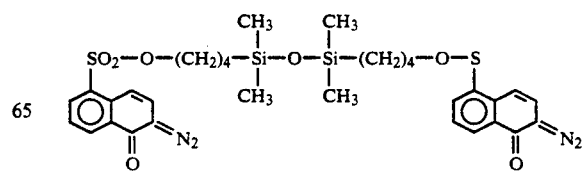

14. The composition of claim 1 wherein said organosilicon is represented by the formula:

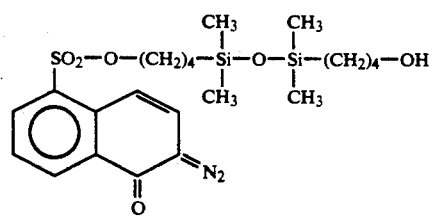

15. The composition of claim 1 wherein said organosilicon is represented by the formula:

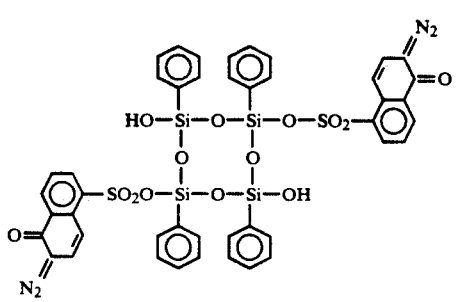

16. The composition of claim 1 wherein said organosilicon is represented by the formula:

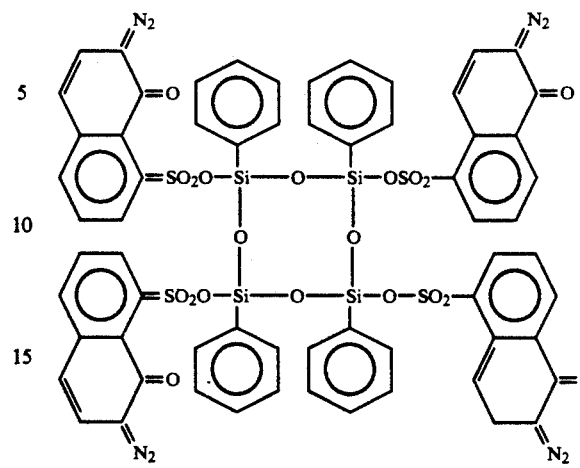

17. The composition of claim 1 wherein said organosilicon is represented by the formula:

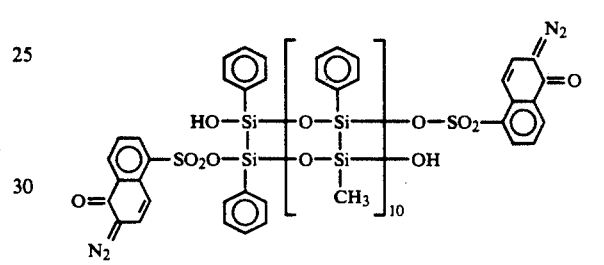

18. The composition of claim 1 wherein said organosilicon is represented by the formula:

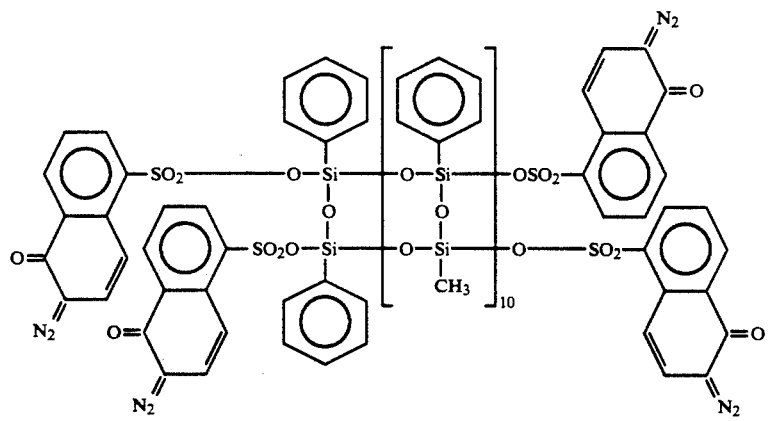

* * * * *